United States Patent [19]

Accou

[11] Patent Number: 4,694,120
[45] Date of Patent: Sep. 15, 1987

[54] FRAMEWORK FOR COMPONENTS

[75] Inventor: Jan F. Accou, Eindhoven, Netherlands

[73] Assignee: U.S. Philips Corporation, New York, N.Y.

[21] Appl. No.: 793,872

[22] Filed: Nov. 1, 1985

[30] Foreign Application Priority Data

Nov. 27, 1984 [NL] Netherlands .......................... 8403596

[51] Int. Cl.⁴ ............................................ H05K 1/00
[52] U.S. Cl. ..................................... 174/68.5; 361/403
[58] Field of Search ......................... 174/68.5; 361/403

[56] References Cited

U.S. PATENT DOCUMENTS

| | | | |
|---|---|---|---|
| 2,895,031 | 7/1959 | Kozacka | 174/68.5 |
| 3,105,729 | 10/1963 | Rosenthal et al. | 174/68.5 |
| 3,165,672 | 1/1965 | Gellert | 174/68.5 |
| 3,268,652 | 8/1966 | Burns et al. | 174/68.5 |
| 3,484,935 | 12/1969 | Burns | 174/68.5 |
| 3,514,538 | 5/1970 | Chadwick et al. | 174/68.5 |
| 3,654,583 | 4/1972 | Mancini | 174/68.5 X |
| 3,873,756 | 3/1975 | Gall et al. | 174/68.5 |
| 3,969,816 | 7/1976 | Swengel, Sr. et al. | 174/68.5 |
| 4,202,091 | 5/1980 | Ohnishi | 29/530 |
| 4,230,385 | 10/1980 | Ammon et al. | 174/68.5 X |

Primary Examiner—Morris H. Nimmo
Attorney, Agent, or Firm—F. Brice Faller

[57] ABSTRACT

Framework for electrical components comprises a metal plate with insulated major surfaces and conductor patterns on opposite sides thereof. Synthetic resin mounting projections are secured to plate by resin passing through holes. Synthetic resin eyelets in holes may be plated to electrically connect conductor patterns on opposite sides.

3 Claims, 4 Drawing Figures

FRAMEWORK FOR COMPONENTS

BACKGROUND OF THE INVENTION

The invention relates to a framework for components in an electrical, electronic or mechanical apparatus, comprising a mounting plate having synthetic resin mounting projections secured thereto through holes in the plate.

Such a framework and a method of manufacturing same are disclosed in U.S. Pat. No. 4,202,091. It may be used in magnetic tape recording and/or playback apparatus in which the framework serves to mount various components, for example, a transformer, a motor, a printed circuit board and a loudspeaker in their places. The synthetic resin projections on both sides of the mounting plate are formed by injection molding of molten synthetic resin in a mould which consists of two matrix halves between which the mounting plate is clamped. After the synthetic resin has solidified by cooling, the mounting plate together with the synthetic resin projections are removed from the mould, each of the synthetic resin projections on one side of the mounting plate being connected through holes in the mounting plate to one or more synthetic resin projections on the other side of the mounting plate. The synthetic resin projections which serve to mount components may have a variety of shapes as described in the above-mentioned U.S. Patent.

In manufacturing electrical or electronic apparatus, small apparatus dimensions are desirable. It is also desired to use a minimum number of assembly steps and individual components. A general attempt to achieve this is to combine the functions of various components.

SUMMARY OF THE INVENTION

It is an object of the invention to achieve better use of the mounting plate and to effect a reduction of the number of components in the electrical, electronic or mechanical apparatus.

According to the invention this object is achieved by a framework as described in the opening paragraph in which the mounting plate is a metal plate which is covered on one or both sides with an electrically insulating layer upon which is superposed an electrically conductive material. The mounting plate may be a stainless steel plate covered with a layer of an epoxy resin bearing a copper foil.

In a particular embodiment of the frame work, the electrically conductive material on the side(s) of the mounting plate is present in the form of conductor patterns. Such conductor patterns may be provided by photo-etching methods.

A metal mounting plate having an insulating layer and thereon a pattern of conductors is known per se; see, for example, U.S. Pat. No. 3,165,672 but in that case the mounting plate does not have synthetic resin mounting projections.

In the framework according to the invention the mounting plate partly or wholly takes over the function of a printed circuit board. Electrical components may be provided directly on the mounting plate to form a desired circuit.

A particularly useful framework is possible if the patterns of conductors and electrical components are provided on each major surface of the mounting plate. However, the problem then occurs that electrical connections between the two sides of a metal mounting plate cannot be produced in the usual manner because, when electrically conductive lead-throughs are used, an electrically conductive connection between the various lead-throughs may be completed by the mounting plate.

According to the invention this problem can be avoided by a framework as described above having conductor patterns on each side of the mounting plate in which one or more connection elements are provided with a substantially central opening providing a passage through the respective hole. The framework is furthermore characterized in that an electrically conductive connection is produced between parts of the conductor patterns on opposite sides of the mounting plate via the passage or passages in the connection elements. Connection elements are to be understood to mean herein the connections of synthetic resin between resin projections on opposite sides of the mounting plate.

Passages in the connection elements are known per se; see U.S. Pat. No. 4,202,091, but there they do not serve to produce an electrically conductive connection between patterns of conductors.

The electrically conductive connection may be a conductive paint, a flattened metal piece, a conductive adhesive or a metal pin through the hole which is connected to the patterns of conductors by soldering, wire-wrapping, or otherwise.

In a particularly efficacious embodiment of the invention the electrically conductive connection is a metal layer provided in the passage. Such a metal layer may be provided by electro-deposition.

A particular advantage of the framework according to the invention is that it can be manufactured simply by means of a new assembly of methods known per se. The number of required treatments in the assembly of an electrical, electronic or mechanical apparatus is reduced.

BRIEF DESCRIPTION OF THE DRAWING

FIG. 1c is an underneath view of the same framework, and in which

EMBODIMENT OF A FRAMEWORK ACCORDING TO THE INVENTION

Figure 1A:
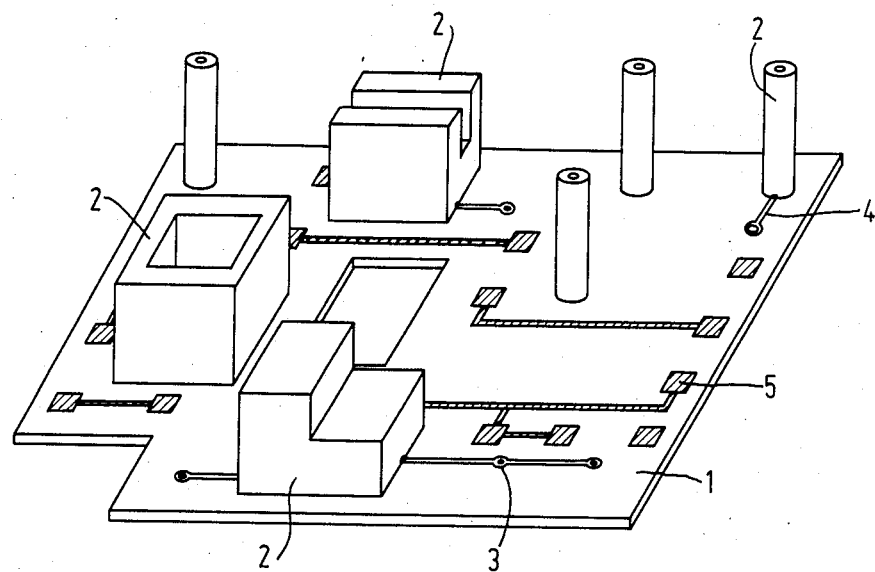
FIG. 1a is a perspective view of a framework according to the invention.
Figure 1B:
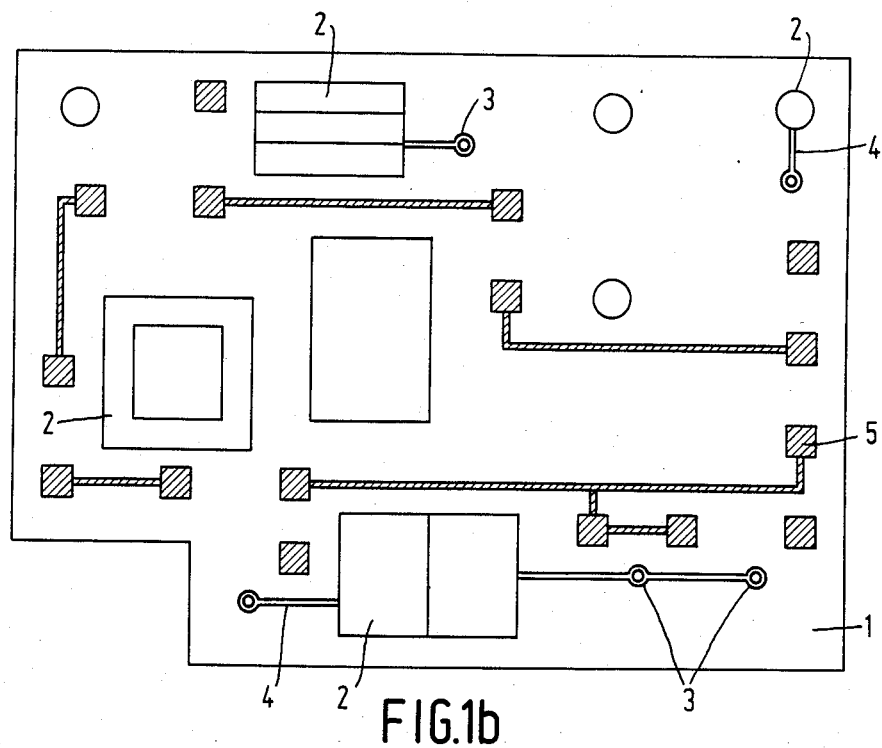
FIG. 1b is a plan view.
Figure 1C:
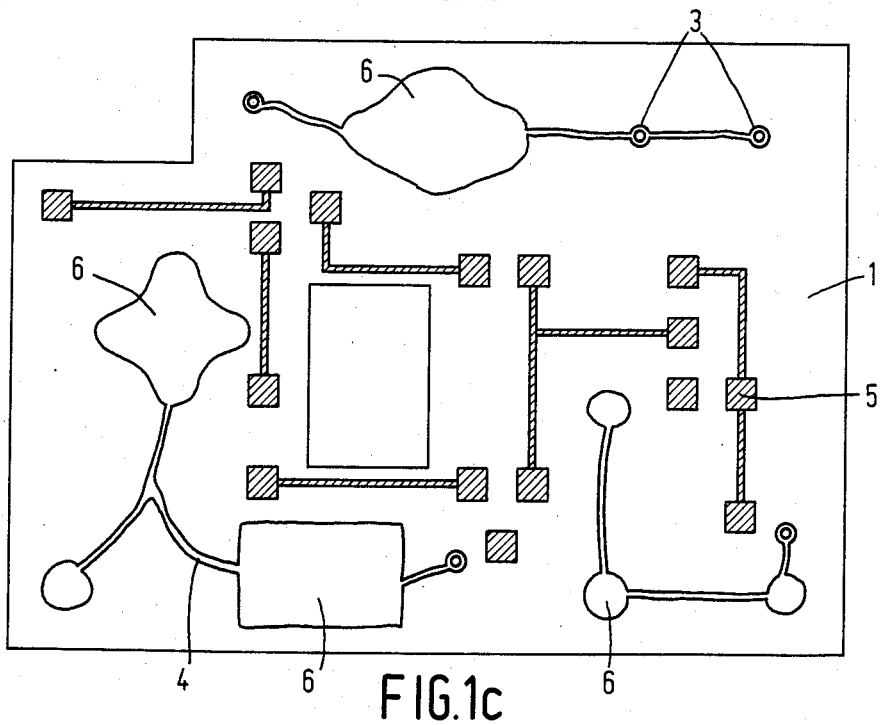

FIG. 1a shows a framework according to the invention having a mounting plate 1 of stainless steel which is covered with an electrically insulating layer of an epoxy resin not shown in the figure. Synthetic resin projections 2 and 6 are present on opposite sides of the mounting plate 1 (FIGS. 1b and 1c) and are connected together by means of connection elements through holes in the mounting plate 1.

A polyamide is used for the synthetic resin projections 2 and 6. Other synthetic resins are also suitable for use in a framework according to the invention, for example, polypropylene, ABS (a copolymer of acrylonitrile, butadiene and styrene), polystyrene, polyphenylene oxide and other thermoplastic synthetic resins. Thermosetting synthetic resins, for example epoxy resin, may also be used. These synthetic resins may comprise the usual fillers, for example, glass fibres.

In the embodiment shown, the synthetic resin mounting projections 2 on one side of the mounting plate 1 form elements which serve to mount components (not shown) to the framework. The synthetic resin projections 6 on the other side of the mounting plate 1 in this example are plate-shaped parts which engage the mounting plate 1 and serve to secure the synthetic resin mounting projections 2 to the mounting plate 1.

The framework further comprises synthetic resin projections 3, the connection elements of which are provided with a substantially central aperture which provides a passage through the hole, thus forming an insulating eyelet. The various synthetic resin projections 2, 3 and 6 in the example are connected together by runners 4 which serve for reinforcement and which in addition enable a good transport of molten synthetic resin during injection molding. As a result of this the number of sprues for the molten synthetic resin may be small.

Patterns of conductors 5 of copper are present on each side of the mounting plate 1.

Figure 2:
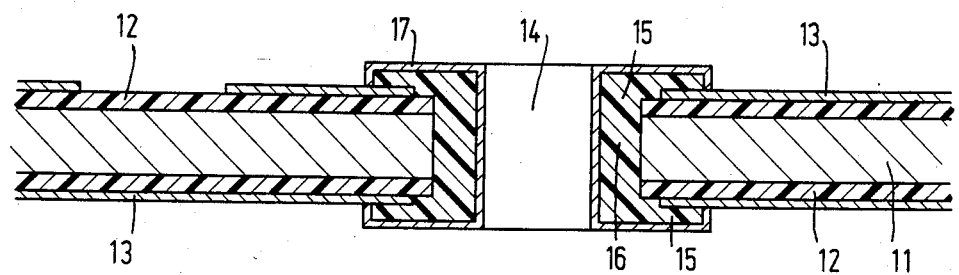
FIG. 2 is a sectional view of an electrically conductive connection in a framework according to the invention.

FIG. 2 is a sectional view through a mounting plate 11 of aluminium which has an electrically insulating layer 12 of an epoxy resin which is coated with patterns 13 of conductors of copper foil. At the position of a hole 14 in the mounting plate 11, two synthetic resin projections or flanges 15, which are integrally formed with connection element 16 to form an insulating eyelet, are present on each side of the mounting plate 11. The connection element 16 has a central aperture which provides a passage through the hole 14, suitable to mount an electrical component.

An electrically conductive layer 17 extending over both the surface of the base of the connection element 16 and over both projections 15 ensures an electrically conductive connection between the conductor patterns 13 on each side of the mounting plate 11. The electrically conductive layer 17 may be provided by a method known per se in which a thin layer of copper is deposited by an electroless reaction on the synthetic resin projections 15 and in the passage 14, after which the layer of copper is reinforced by electrodeposition.

What is claimed is:

1. A framework for components in an electrical or mechanical apparatus comprising a mounting plate comprising a metal plate covered on opposed major surfaces with electrically insulating layers having conductor patterns superimposed thereon, at least one synthetic resin mounting projection molded on one side of said mounting plate, said projection being secured to said mounting plate by synthetic resin molded through at least one respective hole in said plate to engage the opposite side, synthetic resin eyelets molded in holes through said mounting plates, each eyelet having two integral flanges, one said flange molded against each major surface of said board, said eyelets being connected to at least one mounting projection by at least one runner of synthetic resin, said mounting projection and said eyelets being integrally molded.

2. A framework as in claim 1 wherein said eyelets are provided with means to electrically connect conductor patterns on opposite sides of said mounting plate.

3. A framework as in claim 2 wherein said eyelets are plated to connect conductor patterns on opposite sides of said mounting plate.

* * * * *